United States Patent
Jung et al.

(10) Patent No.: US 9,496,323 B2
(45) Date of Patent: Nov. 15, 2016

(54) ORGANIC LIGHT EMITTING DIODE DISPLAY, MANUFACTURING METHOD THEREOF, AND ROTATING DEVICE FOR CIRCUIT FILM

(71) Applicant: Samsung Display Co., Ltd., Yongin-si, Gyeonggi-do (KR)

(72) Inventors: Hae-Goo Jung, Yongin-si (KR); Do-Hyung Ryu, Yongin-si (KR)

(73) Assignee: Samsung Display Co., Ltd., Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/876,243

(22) Filed: Oct. 6, 2015

(65) Prior Publication Data

US 2016/0027861 A1    Jan. 28, 2016

Related U.S. Application Data

(62) Division of application No. 14/052,427, filed on Oct. 11, 2013, now Pat. No. 9,190,459.

(30) Foreign Application Priority Data

Oct. 16, 2012  (KR) .......................... 10-2012-0114826

(51) Int. Cl.
  *H01L 29/08* (2006.01)
  *H01L 29/04* (2006.01)
  *H01L 23/48* (2006.01)
  (Continued)

(52) U.S. Cl.
  CPC ........... *H01L 27/3276* (2013.01); *H01L 25/18* (2013.01); *H01L 25/50* (2013.01); *H01L 27/3244* (2013.01); *H01L 51/5237* (2013.01); *H01L 51/56* (2013.01); *H01L 2227/323* (2013.01); *H01L 2251/5338* (2013.01)

(58) Field of Classification Search
  CPC ... H01L 27/3276; H01L 25/18; H01L 25/50; H01L 51/5237; H01L 51/56; H01L 27/3244; H01L 2227/323; H01L 2251/5338
  USPC .......................................... 257/40, 778, 737
  See application file for complete search history.

(56) References Cited

U.S. PATENT DOCUMENTS 5,448,511 A * 9/1995 Paurus ................ H01L 25/0657
                                                        257/686
7,439,540 B2   10/2008 Chang et al.
(Continued)

FOREIGN PATENT DOCUMENTS

| KR | 10-2007-0095030 | 9/2007 |
| KR | 10-2011-0077550 | 7/2011 |
| KR | 10-2012-0018063 | 2/2012 |

*Primary Examiner* — Dzung Tran
(74) *Attorney, Agent, or Firm* — Robert E. Bushnell, Esq.

(57) ABSTRACT

A manufacturing method of an organic light emitting diode (OLED) display includes: supplying a circuit film on the pad area of the display panel and bonding a first end portion of the circuit film to the pad area; vertically standing and inserting the display panel in a bonding device; holding a portion of the circuit film including a second end portion to be horizontal by using a rotating device including a vacuum absorbing portion; supplying a printed circuit board (PCB) into a space under the second end portion of the circuit film, and attaching the printed circuit board to the second end portion of the circuit film; and operating the rotating device to move the second end portion to a vertical position, and separating the circuit film from the vacuum absorbing portion.

12 Claims, 11 Drawing Sheets

(51) Int. Cl.
  *H01L 21/00* (2006.01)
  *H01L 27/32* (2006.01)
  *H01L 25/18* (2006.01)
  *H01L 25/00* (2006.01)
  *H01L 51/52* (2006.01)
  *H01L 51/56* (2006.01)

(56) References Cited

U.S. PATENT DOCUMENTS

| | | |
|---|---|---|
| 2004/0043540 A1 | 3/2004 | Kinsman |
| 2004/0150085 A1 | 8/2004 | Takahashi et al. |
| 2005/0012199 A1* | 1/2005 | Rosenau ............... G02B 6/4201 257/696 |
| 2005/0197030 A1 | 9/2005 | Yamazaki et al. |
| 2005/0243239 A1* | 11/2005 | Kondo ................ G02F 1/13452 349/58 |
| 2006/0109394 A1 | 5/2006 | Miyagawa et al. |
| 2006/0221269 A1* | 10/2006 | Kawaguchi ....... G02F 1/133308 349/58 |
| 2008/0165316 A1* | 7/2008 | Hasegawa ........... G02F 1/13452 349/149 |
| 2008/0192037 A1 | 8/2008 | Lee et al. |
| 2009/0257181 A1 | 10/2009 | Ha et al. |
| 2011/0254758 A1 | 10/2011 | Lin et al. |
| 2011/0291119 A1 | 12/2011 | Ryu et al. |

* cited by examiner

ORGANIC LIGHT EMITTING DIODE DISPLAY, MANUFACTURING METHOD THEREOF, AND ROTATING DEVICE FOR CIRCUIT FILM

CROSS-REFERENCE TO RELATED APPLICATIONS AND CLAIM OF PRIORITY

This application is a divisional application of the prior application Ser. No. 14/052,427 filed in the U.S. Patent & Trademark Office on Oct. 11, 2013 and assigned to the assignee of the present invention. Furthermore, this application claims priority to and the benefit of Korean Patent Application No. 10-2012-0114826 filed in the Korean Intellectual Property Office on Oct. 16, 2012, the entire contents of which are incorporated herein by reference.

BACKGROUND OF THE INVENTION

1. Field of the Invention

The described technology relates generally to an organic light emitting diode (OLED) display. More particularly, the described technology relates generally to an organic light emitting diode (OLED) display including a circuit film and a printed circuit board (PCB), a manufacturing method thereof, and a rotating device of a circuit film used in a manufacturing process of the organic light emitting diode (OLED) display.

2. Description of the Related Art

Unlike the liquid crystal display (LCD), an organic light emitting diode (OLED) display does not require a separate light source, thereby making it possible to be implemented as a slim and lightweight display. Furthermore, the OLED display has high quality characteristics such as lower power consumption, high luminance, and short response time.

The organic light emitting diode (OLED) display includes a display panel having a plurality of signal lines and a plurality of pixels, a printed circuit board (PCB) formed with a control circuit transmitting a control signal to the display panel, and a circuit film connecting the display panel and the printed circuit board (PCB). The circuit film is formed of a flexible printed circuit film, a chip on film, or a tape carrier package.

The display panel includes a substrate and an encapsulation member covering and protecting a plurality of pixels formed on the substrate. One end of the circuit film is a pad region of the substrate, and the other end of the circuit film that is away from the substrate is attached to the printed circuit board (PCB).

In a case of a top light emitting type in which the light of the display panel is transmitted through the encapsulation member to be emitted, the circuit film is bent toward an outer surface of the substrate for the printed circuit board (PCB) to be positioned outside the substrate. In a case of a bottom light emitting type in which the light of the display panel is transmitted through the substrate to be emitted, the circuit film is bent toward the encapsulation member for the printed circuit board (PCB) to be positioned outside the encapsulation member.

In the above-described structure, the circuit film is attached to the substrate and then is bent such that adherence with the substrate becomes weak and moisture penetrates into an adhesion portion with the substrate, and thereby adhesion reliability may deteriorate. Also, a length of the circuit film must be increased to bend the circuit film and a dead space is expanded by the bent portion of the circuit film that is positioned outside a pad region of the substrate thereby causing an increase in the width of a bezel.

The above information disclosed in this Background section is only for enhancement of understanding of the background of the described technology and therefore it may contain information that does not form the prior art that is already known in this country to a person of ordinary skill in the art.

SUMMARY

The present invention provides an organic light emitting diode (OLED) display improving an adhesion structure of a circuit film and a printed circuit board (PCB) to increase adhesion reliability of a circuit film and to reduce a dead space, and a manufacturing method thereof. Also, the present invention provides a rotating device of a circuit film used in a manufacturing process of an organic light emitting diode (OLED) display.

An organic light emitting diode (OLED) display according to an exemplary embodiment includes: a display panel including a substrate having a display area and a pad area, and an encapsulation member covering the display area; a printed circuit board (PCB) positioned outside the encapsulation member; and a circuit film including a first end portion formed with a first bonding surface that is attached to the pad area and a second end portion formed with a second bonding surface that is attached to the printed circuit board (PCB). The circuit film maintains a flatness from the first end portion to the second end portion, and the first bonding surface and the second bonding surface are positioned facing the substrate.

The organic light emitting diode display may include a gate driver, gate wires, a data driver, data wires, and a plurality of pixels. The display panel may include the plurality of pixels positioned on the display area, and the display panel may include the gate wires and the data wires positioned on both the display area and the pad area.

At least one of the gate driver and the data driver may be installed to the circuit film to drive the display panel, and the circuit film may be made of a chip on film or a tape carrier package. The gate driver and the data driver may be positioned on the pad area as a chip on glass, and the circuit film may be made of a flexible printed circuit film.

A manufacturing method of an organic light emitting diode (OLED) display according to an exemplary embodiment includes: supplying a circuit film on a pad area of a display panel and bonding a first end portion of the circuit film to the pad area; vertically standing the display panel and inserting the display panel in a bonding device; holding a portion of the circuit film including a second end portion and moving the second end portion to a horizontal position by operating a rotating device including a vacuum absorbing portion; supplying a printed circuit board (PCB) into a space under the second end portion of the circuit film, and attaching the printed circuit board (PCB) to the second end portion of the circuit film; and operating the rotating device to move the second end portion to a vertical position, and separating the circuit film from the vacuum absorbing portion.

The display panel may include a substrate having a display area and a pad area, and an encapsulation member covering the display area. In the step of supplying the circuit film on the pad area of the display panel, the circuit film may be disposed on the display panel such that the first end portion may overlap the pad area and the second end portion may overlap the encapsulation member. In the step of supplying the circuit film on the pad area of the display panel, the display panel may be maintained in a state of being parallel to a ground surface.

The rotating device may include: a vacuum absorbing portion including a plurality of vacuum nozzles and absorbing a portion of the circuit film including the second end portion by using a vacuum pressure; a connection pipe connected to the vacuum absorbing portion; and a driver installed to an end portion of the connection pipe and having a capability of rotating the connection pipe and the vacuum absorbing portion by 90 degrees.

The rotating device may comprise a plurality of vacuum absorbing portions. The number of the vacuum absorbing portions may be the same as a number of circuit films arranged on the pad area, and the connection pipe may be coupled to a plurality of vacuum absorbing portions. An adhesion member made of an anisotropic conductive film (ACF) may be positioned between the first bonding surface of the first end portion and the pad area, and may be positioned between the second bonding surface of the second end portion and the printed circuit board (PCB).

A rotating device for a circuit film according to an exemplary embodiment is installed in a bonding device bonding a circuit film and a printed circuit board (PCB). The rotating device holds an end portion of the circuit film to be horizontal. The rotating device includes: a plurality of vacuum absorbing portions with each of the vacuum absorbing portions including a plurality of vacuum nozzles at one surface facing the circuit film and absorbing a portion of the circuit film by using a vacuum pressure; a connection pipe connected to the plurality of vacuum absorbing portions where the connection pipe includes an inner space connected to an interior of the plurality of vacuum absorbing portions; a driver installed to an end portion of the connection pipe and having a capability of rotating the connection pipe and the plurality of vacuum absorbing portions by 90 degrees; and a vacuum pump and a control valve connected to the connection pipe.

Each of the plurality of the vacuum absorbing portions may further include at least one vacuum pad manufactured of an elastic material. The driver may include a rotating axis coupled to the connection pipe in an end portion of the connection pipe, and a driving motor coupled to the rotating axis. The rotating axis of the driver may be positioned off from a center line of the connection pipe, the rotating device for the circuit film may further include a coupling member coupling the connection pipe to the rotating axis while closing and sealing the end portion of the connection pipe.

The circuit film of the organic light emitting diode (OLED) display is attached to the substrate and is not bent such that adhesion reliability deterioration such as adherence weakness or moisture penetration is not generated and it is not protruded outside the display panel such that the dead space may be reduced. In the manufacturing process of the organic light emitting diode (OLED) display, the sufficient space where the display panel is not interfered with under the second end portion of the circuit film by the rotating device is provided such that the bonding work of the circuit film and the printed circuit board (PCB) may be easily performed.

DETAILED DESCRIPTION

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Unless explicitly described to the contrary, the word "comprise" and variations such as "comprises" and "comprising" will be understood to imply the inclusion of stated elements but not the exclusion of any other elements. In addition, it will be understood that when an element such as a layer, film, region, or substrate is referred to as being "on" another element, it can be directly on the other element or intervening elements may also be present. Throughout this specification, it is understood that the term "on" and similar terms are used generally and are not necessarily related to a gravitational reference.

Figure 1:
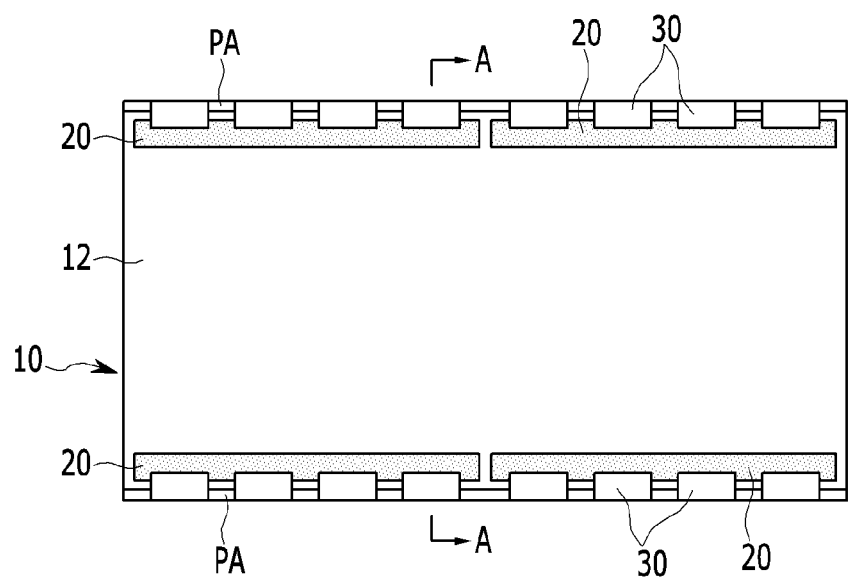
FIG. 1 is a top plan view of an organic light emitting diode (OLED) display according to the first exemplary embodiment.
Figure 2:
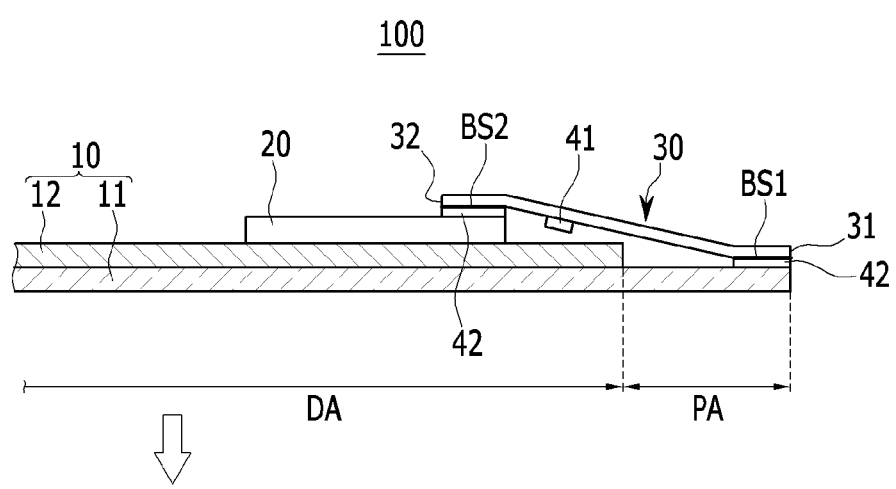
FIG. 2 is a cross-sectional view of the organic light emitting diode (OLED) display of FIG. 1 taken along the line A-A.

FIG. 1 is a top plan view of an organic light emitting diode (OLED) display according to the first exemplary embodiment, and FIG. 2 is a cross-sectional view of the organic light emitting diode (OLED) display of FIG. 1 taken along the line A-A.

Referring to FIG. 1 and FIG. 2, the organic light emitting diode (OLED) display 100 of the first exemplary embodiment includes a display panel 10 displaying an image, a printed circuit board (PCB) 20 including a control circuit transmitting a control signal to the display panel 10, and a circuit film 30 electrically and physically connecting the display panel 10 to the printed circuit board (PCB) 20.

The circuit film 30 as an insulating film such as polyimide including a wire pattern includes a first end portion 31 attached to the display panel 10 and a second end portion 32 attached to the printed circuit board (PCB) 20. The circuit film 30 totally overlaps the display panel 10 and does not include a bent portion or a portion that is protruded outside the display panel 10. That is, the circuit film 30 substantially maintains flatness from the first end portion 31 to the second end portion 32.

Figure 3:
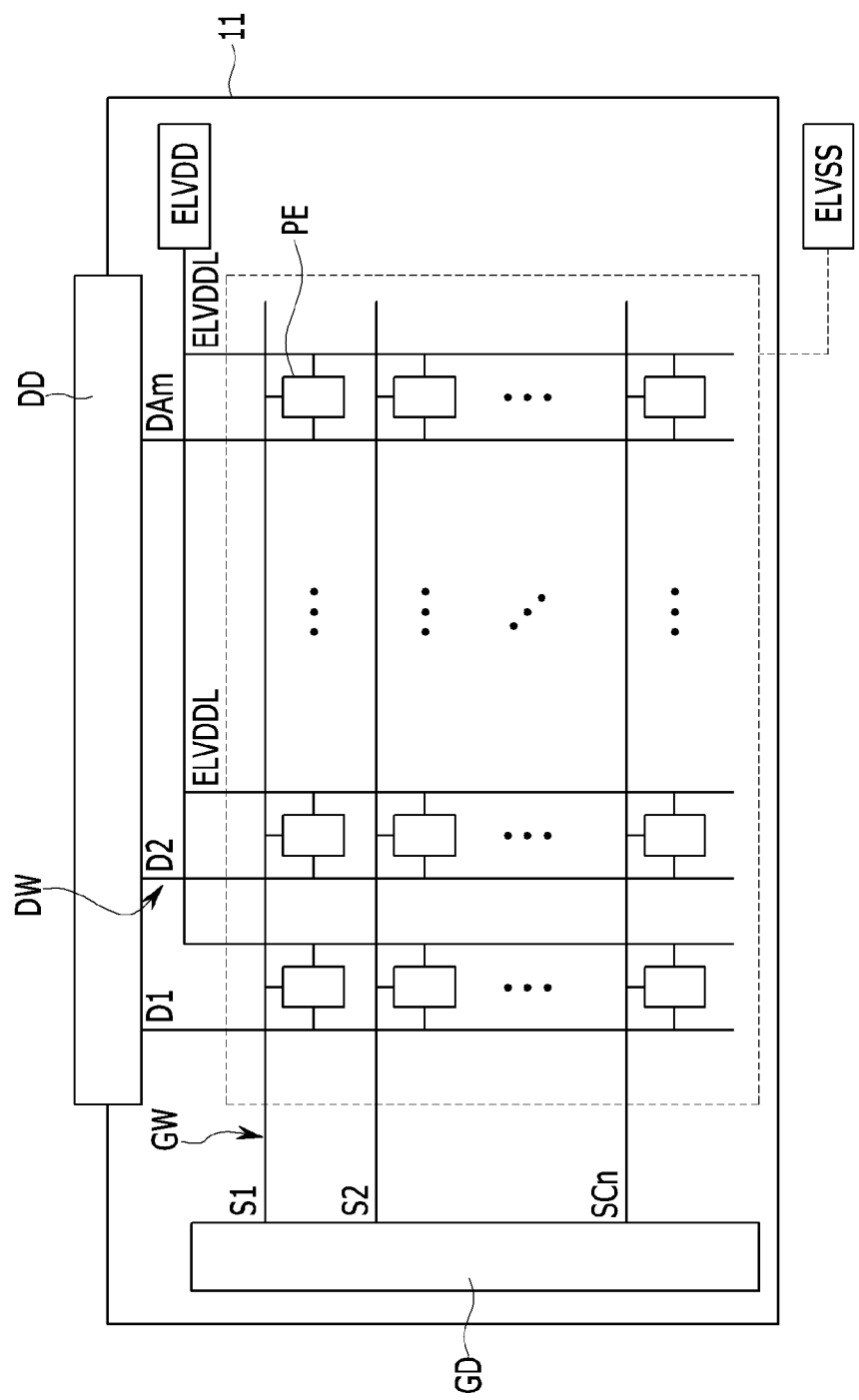
FIG. 3 is a schematic diagram of a display panel among the organic light emitting diode (OLED) display of FIG. 1.

FIG. 3 is a schematic diagram of a display panel among the organic light emitting diode (OLED) display of FIG. 1.

Referring to FIG. 3, the display panel 10 includes a substrate 11, a gate driver GD, gate wires GW, a data driver DD, data wires DW, and a plurality of pixels PE. Here, the pixel PE is a minimum unit displaying an image, and the display panel 10 displays the image by using the light emitted from the plurality of pixels PE.

The gate driver GD is connected to the gate wires GW, and the gate wires GW include scan lines S1-SCn. The gate driver GD sequentially supplies a scan signal to the gate wires GW corresponding to a control signal supplied by an external control circuit, for example, a timing controller. The pixel PE is selected by the scan signal to sequentially receive a data signal.

The data driver DD is connected to the data wires DW, and the data wires DW include the data lines D1-Dm and a driving power source line ELVDDL. The driving power source line ELVDDL is connected to the first power source ELVDD from the outside and receives driving power from the first power source ELVDD.

The data driver DD supplies a data signal to a data line DAm from among the data wires DW corresponding to a control signal supplied by the timing controller. The data signal supplied to the data line DAm is supplied to the pixel PE selected by the scan signal when the scan signal is supplied to the scan line SCn. The pixel PE is charged with a voltage corresponding to the data signal and emits light with corresponding luminance.

The pixel PE is positioned at a region where the gate wires GW and the data wires DW are crossed, and is connected to the gate wires GW and the data wires DW. The pixel PE includes the first power source ELVDD, two thin film transistors (a switching transistor and a driving transistor), a capacitor connected to the gate wires GW and the data wires DW, and an organic light emitting element connected to the second power source ELVSS via the thin film transistor.

The organic light emitting diode (OLED) includes an anode connected to an output terminal of the driving transistor, a cathode connected to the second power source ELVSS, and an organic emission layer positioned between the anode and the cathode. The organic light emitting diode (OLED) emits light having intensity depending on an output current of the driving transistor, and thereby the display panel 10 including a plurality of pixels PE displays predetermined images.

Referring to FIG. 1 to FIG. 3, the display panel 10 includes the substrate 11 having a display area DA and a pad area PA positioned outside the display area DA, and an encapsulation member 12 fixed on the substrate 11 to cover the display area DA. FIG. 1 exemplarily illustrates the pad area PA that is positioned at lower and upper end portions of the display panel 10, but the location of the pad area PA is not limited thereto.

The substrate 11 is formed of a transparent insulation substrate such as glass or polymer, and when the substrate 11 is formed of the polymer film, a flexible characteristic may be provided. The encapsulation member 12 may be formed of glass, a polymer film, a metal, or a thin film encapsulation layer in which a plurality of organic layers and a plurality of inorganic layers are alternately and repeatedly deposited at least one time. The encapsulation member 12 encapsulates the plurality of pixels PE to protect them from external moisture and oxygen.

The plurality of pixels PE are positioned in the display area DA, and the gate wires GW and the data wires DW are entirely positioned in the display area DA and the pad area PA. At least one of the gate driver GD and the data driver DD may be mounted to the circuit film 30 as a driving chip 41.

In the organic light emitting diode (OLED) display 100 of the first exemplary embodiment, the circuit film 30 may be constituted of a chip on film or a tape carrier package, including the driving chip 41.

The display panel 10 is a bottom light emitting type in which the light emitted from the plurality of pixels PE is transmitted through the substrate 11 to be emitted. In FIG. 2, a direction in which the light is emitted is indicated by an arrow. The printed circuit board (PCB) 20 is positioned outside the encapsulation member 12 for the light emitted from the display area DA to not be covered.

The first end portion 31 of the circuit film 30 positioned on the pad area PA, and the second end portion 32 of the circuit film 30 is positioned on the printed circuit board (PCB) 20. The first end portion 31 of the circuit film 30 is fixed to the pad area PA by an adhesion member 42, and the second end portion 32 of the circuit film 30 is fixed to the printed circuit board (PCB) 20 by the adhesion member 42. The adhesion member 42 may be formed of an anisotropic conductive film (ACF) in which conductive particles are dispersed in a thermosetting or thermoplastic resin layer.

The circuit film 30 totally overlaps the display panel 10 without a portion that is protruded outside the display panel 10 and does not include a bent portion. In other words, the circuit film 30 is covered by the display panel 10. Accordingly, the circuit film 30 maintains flatness from the first end portion 31 to the second end portion 32. Here, to maintain the flatness means that the circuit film 30 does not include a portion that is bent or curved. However, the circuit film 30 may have a portion that is slightly deformed by a height difference of the pad area PA and the printed circuit board (PCB) 20.

The first bonding surface BS1 attached to the pad area PA is formed in the first end portion 31 of the circuit film 30, and the second bonding surface BS2 attached to the printed circuit board (PCB) 20 is formed in the second end portion 32. The first bonding surface BS1 and the second bonding surface BS2 are positioned to be toward the substrate 11. In other words, the first and second bonding surfaces BS1 and BS2 face the substrate 11 from the circuit film 30. The first bonding surface BS1 and the second bonding surface BS2 are areas exposing a wire pattern of the circuit film 30, and the first bonding surface BS1 and the second bonding surface BS2 are positioned at the same surface of the circuit film 30 thereby using the circuit film 30 having a simple layering wire structure.

In the above-described organic light emitting diode (OLED) display 100, the circuit film 30 is not bent after being attached to the substrate 11 such that adhesion reliability deterioration such as adherence weakness or moisture penetration is not generated. Also, it is not necessary to bend the circuit film 30 such that the length of the circuit film 30 may be reduced, and the circuit film 30 is protruded outside the display panel 10 such that the dead space may be reduced and the width of the bezel may be reduced.

Figure 4:
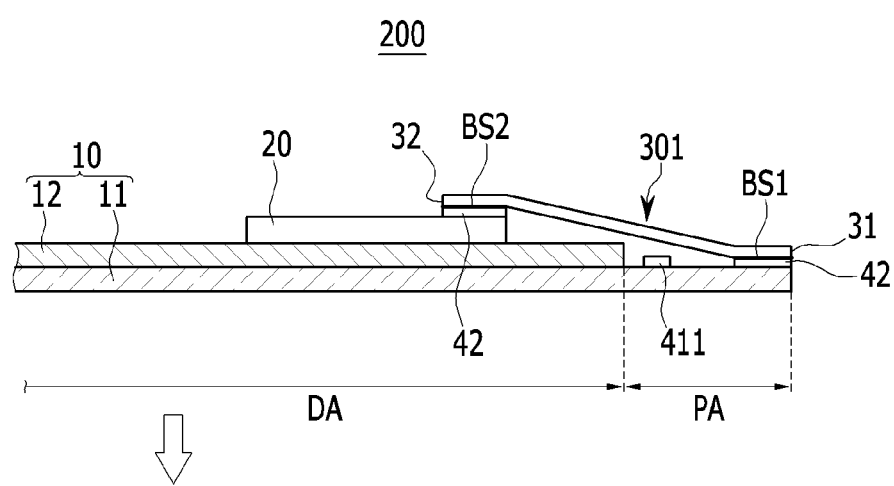
FIG. 4 is a cross-sectional view of an organic light emitting diode (OLED) display according to the second exemplary embodiment.

FIG. 4 is a cross-sectional view of an organic light emitting diode (OLED) display according to the second exemplary embodiment.

Referring to FIG. 3 and FIG. 4, in the organic light emitting diode (OLED) display 200 according to the second exemplary embodiment, the gate driver GD and the data driver DD are positioned on the pad area with the chip on glass type, and a circuit film 301 is formed of a flexible printed circuit film without the driving chip. In FIG. 4, reference numeral 411 indicates a driving chip functioning as the gate driver GD or the data driver DD.

An organic light emitting diode (OLED) display 200 of the second exemplary embodiment has the same configuration as the organic light emitting diode (OLED) display 100 of the first exemplary embodiment except for the position of the driving chip 411 and the kind of circuit film 301.

That is, the circuit film 301 of the second exemplary embodiment entirely overlaps the display panel 10 without a portion that is protruded outside the display panel 10 and does not include a bent portion. In other words, the circuit film 30 is covered by the display panel 10. The circuit film 301 maintains the flatness from the first end portion 31 to the second end portion 32, and the first bonding surface BS1 and the second bonding surface BS2 are positioned to be toward the substrate 11.

Meanwhile, a manufacturing process of the described organic light emitting diode (OLED) displays 100 and 200 includes a first bonding step bonding the first end portion 31 of the circuit films 30 and 301 to the pad area PA of the substrate 11 and a second bonding step bonding the printed circuit board (PCB) 20 to the second end portion 32 of the circuit films 30 and 301.

At this time, in the second bonding step, the second end portion 32 of the circuit films 30 and 301 is positioned within the periphery of the display panel 10 such that bonding work of the circuit films 30 and 301 and the printed circuit board (PCB) 20 by using a general manufacturing device that is optimized for a case that the second end portion 32 of the circuit films 30 and 301 is positioned outside the display panel 10 is difficult.

Next, a manufacturing method of the organic light emitting diode (OLED) displays 100 and 200 that is capable of easily bonding the circuit films 30 and 301 and the printed circuit board (PCB) 20 will be described.

Figure 5:
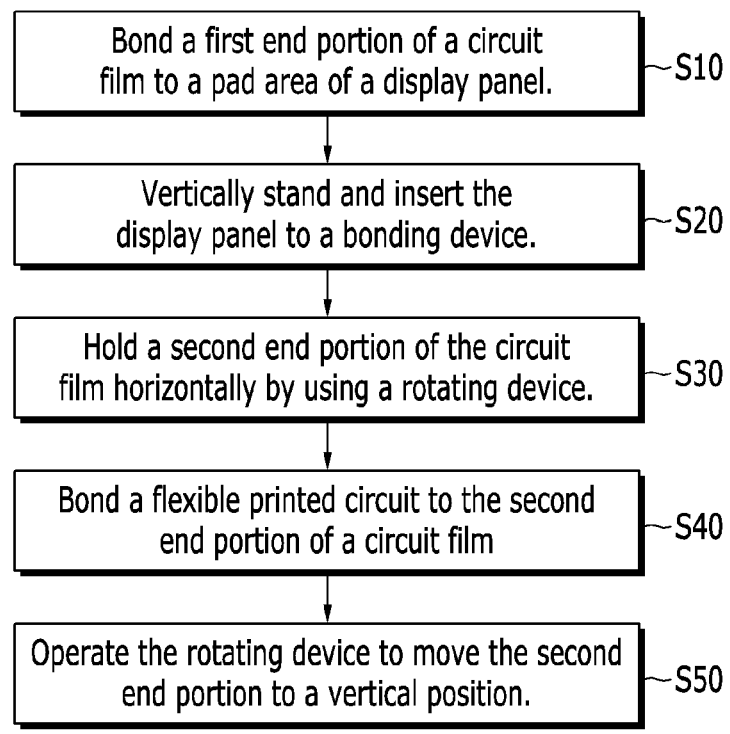
FIG. 5 is a process flowchart of a manufacturing method of an organic light emitting diode (OLED) display according to the third exemplary embodiment.

FIG. 5 is a process flowchart of a manufacturing method of an organic light emitting diode (OLED) display according to the third exemplary embodiment.

Referring to FIG. 5, the manufacturing method of the organic light emitting diode (OLED) display according to the third exemplary embodiment includes a first step S10 of bonding the first end portion of the circuit film to the pad area of the display panel, a second step S20 of vertically standing and inserting the display panel in a bonding device, a third step S30 of taking up a portion of the circuit film including the second end portion to be horizontal by using a rotating device, a fourth step S40 of bonding the printed circuit board (PCB) to the second end portion of the circuit film, and a fifth step S50 of returning the rotating device to an original position and discharging the display panel.

Figure 6:
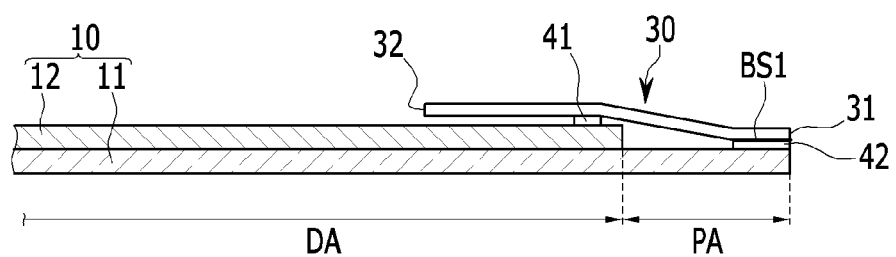
FIG. 6 and FIG. 7 are cross-sectional views of an organic light emitting diode (OLED) display of the first step and the second step shown in FIG. 5.

FIG. 6 is a cross-sectional view of the organic light emitting diode (OLED) display of the first step S10 shown in FIG. 5.

Referring to FIG. 6, the adhesion member 42 and the circuit film 30 are provided on the pad area PA of the display panel 10 in the first step S10. The circuit film 30 is disposed on the display panel 10 such that the first end portion 31 overlaps the adhesion member 42 and the pad area PA, and the second end portion 32 overlaps the encapsulation member 12. At this time, the display panel 10 may be maintained parallel to a ground surface.

Next, heat and pressure are provided to the first end portion 31 of the circuit film 30. Thus, while the conductive particles inside the adhesion member 42 contact the wire of the pad area PA and the wire of the first bonding surface BS1, the pad area PA and the circuit film 30 are electrically connected.

Figure 7:
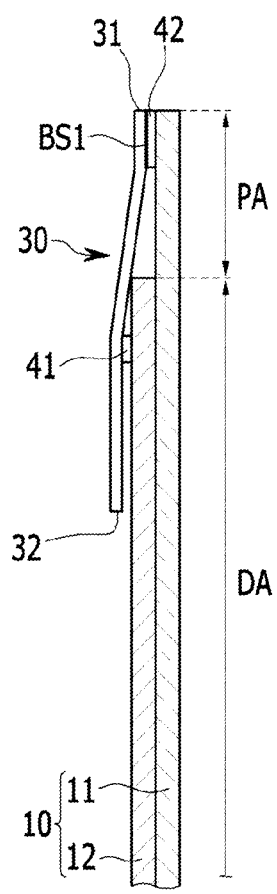

FIG. 7 is a cross-sectional view of the organic light emitting diode (OLED) display of the second step S20 shown in FIG. 5.

Referring to FIG. 7, the display panel 10 stands vertically and is inserted in a bonding device (not shown) in the second step S20. Accordingly, the display panel 10 maintains the state of being vertical to the ground surface at 90 degrees in the bonding device.

The bonding device includes a rotating device (element 50 shown in FIG. 8) absorbing and taking up the portion of the circuit film 30 including the second end portion 32 to be in a horizontal state. The bonding device also includes a general device supplying an adhesion member and a printed circuit board (PCB) under the second end portion 32 of the circuit film 30 and providing the heat and the pressure to the second end portion 32 of the circuit film 30. Next, the rotating device in the boding device will be described with reference to accompanying drawings.

Figure 8:
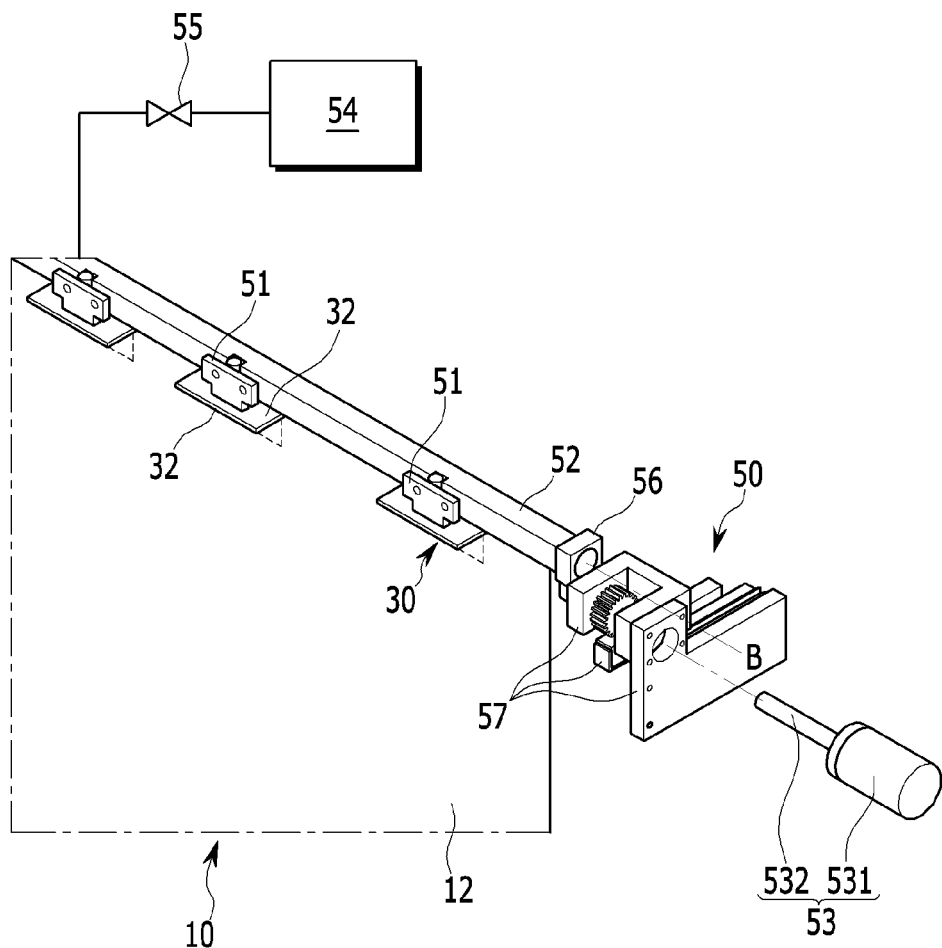
FIG. 8 is an enlarged perspective view of the organic light emitting diode (OLED) display of the third step shown in FIG. 5.
Figure 9:
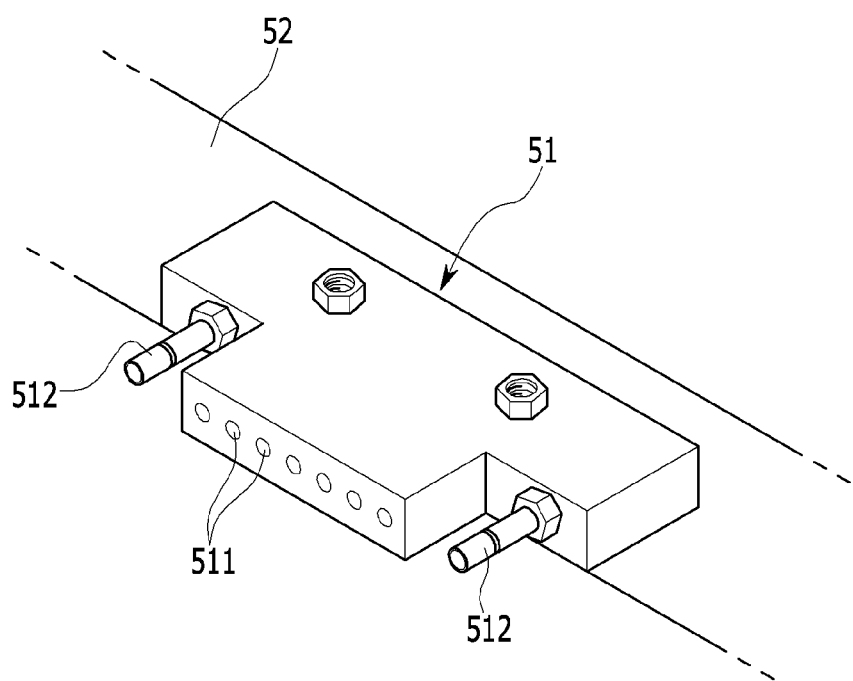
FIG. 9 is a perspective view of a vacuum absorbing portion among the rotating device shown in FIG. 8.

FIG. 8 is an enlarged perspective view of the organic light emitting diode (OLED) display of the third step shown in FIG. 5, and FIG. 9 is a perspective view of a vacuum absorbing portion among the rotating device shown in FIG. 8.

Referring to FIG. 8 and FIG. 9, the portion of the circuit film 30 including the second end portion 32 in the third step S30 is absorbed to the rotating device 50, and then is taken up to be in the horizontal state. Accordingly, the second end portion 32 of the circuit film 30 is separated from the encapsulation member 12 such that a sufficient space is formed so as to not generate interference with the display panel 10 under the second end portion 32. The adhesion member and the printed circuit board (PCB) are supplied through this space and the printed circuit board (PCB) may be easily bonded to the second end portion 32.

The rotating device 50 includes a plurality of vacuum absorbing portions 51 absorbing the portion of the circuit film 30 including the second end portion 32 by using vacuum pressure, a connection pipe 52 connecting the plurality of vacuum absorbing portions 51 to each other, a driver 53 being installed to the end portion of the connection pipe 52 and moving the connection pipe 52, and a vacuum pump 54 and a control valve 55 combined to the connection pipe 52.

The vacuum absorbing portions 51 are provided with the same number as the circuit films 30 positioned at one end portion of the display panel 10, and one vacuum absorbing portion 51 is disposed corresponding to each circuit film 30. The vacuum absorbing portion 51 has a structure of a box shape that is empty therein, and a plurality of vacuum nozzles 511 are formed at one surface toward the circuit film 30.

The vacuum absorbing portion 51 may further include a pair of vacuum pads 512 made of an elastic material such as a rubber such that the absorbing of the circuit film 30 may be further smooth. A plurality of vacuum nozzles 511 are positioned between a pair of vacuum pads 512.

A plurality of vacuum absorbing portions 51 are fixed to the connection pipe 52, and an inner space of the connection pipe 52 is connected to the inside of the vacuum absorbing portion 51 and the vacuum pump 54. Accordingly, a vacuum pressure generated by the vacuum pump 54 is uniformly applied to a plurality of vacuum absorbing portions 51 through the connection pipe 52, and is used for absorbing (or suctioning) the circuit film 30. The connection pipe 52 is positioned in parallel to the pad area of the display panel 10.

The driver 53 includes a driving motor 531 and a rotating axis 532. The rotating axis 532 is fixed at a position separated from the shape center of the connection pipe 52 by a predetermined distance at the end portion of the connection pipe 52. For this, a coupling member 56 couples the connection pipe 52 to the rotating axis 532 while closing and sealing the end portions of the connection pipe 52. In FIG. 8, the shape center of the connection pipe 52 is indicated by a line B, which is a center line of the connection pipe 52, and the rotating axis 532 is positioned under the shape center of the connection pipe 52 as shown in FIG. 8. In other words, the center line B of the connection pipe 52 is off from a center line of the rotating axis 532.

In FIG. 8, reference numeral 57 represents a supporting member supporting the connection pipe 52 and the driver 53. If the rotating axis 532 is rotated by the operation of the driving motor 531, the connection pipe 52 is rotated with the center of the rotating axis 532 to change the position of the vacuum absorbing portion 51.

In the bonding device, the display panel 10 is inserted before the rotating device 50 by a transferring device (not shown) such as a roller transferring unit. Directly after the insertion of the display panel 10, the vacuum absorbing portion 51 of the rotating device 50 is positioned for a plurality of vacuum nozzles 511 to face a lower outer surface of the circuit film 30. If the vacuum pump 54 is operated and the control valve 55 is opened, a vacuum intake is generated at the plurality of vacuum nozzles 511. Accordingly, the lower portion of the circuit film 30 including the second end portion 32 is strongly absorbed to the vacuum absorbing portion 51.

Next, if the rotating axis 532 is rotated by the driving motor 531, while the connection pipe 52 and the vacuum absorbing portion 51 are rotated 90 degrees, the lower portion of the circuit film 30 is taken up to be in the horizontal state. Accordingly, the second end portion 32 of the circuit film 30 moves away from the display panel 10, and a space to bond the printed circuit board (PCB) is provided under the second end portion 32. At this time, a plurality of vacuum absorbing portions 51 are simultaneously rotated by the connection pipe 52 such that a plurality of circuit films 30 are simultaneously taken up.

The described rotating device 50 is not limited to the shown elements, and any structure that absorbs the portion of the circuit film 30 by using the vacuum pressure and takes up the portion of the absorbed circuit film 30 by using a physical force may be applicable.

Figure 10:
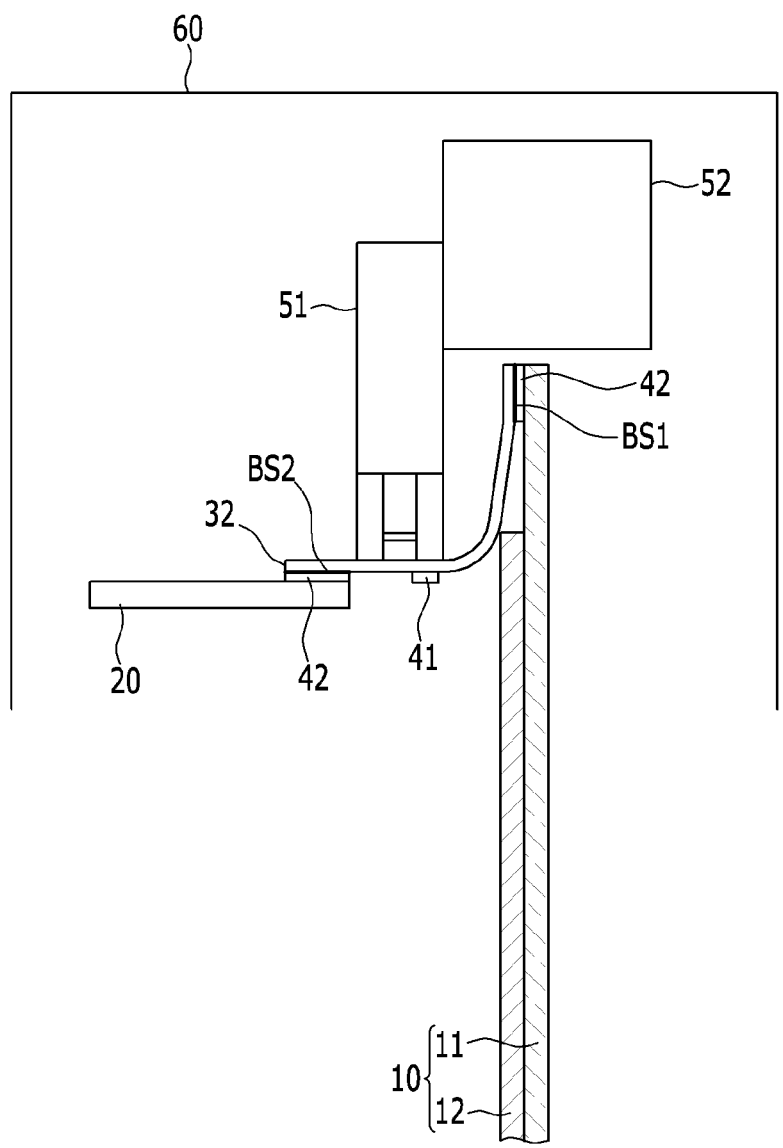
FIG. 10 and FIG. 11 are cross-sectional views of an organic light emitting diode (OLED) display of the fourth step and the fifth step shown in FIG. 5.

FIG. 10 is a cross-sectional view of an organic light emitting diode (OLED) display of the fourth step shown in FIG. 5.

Referring to FIG. 10, in the fourth step S40, the adhesion member 42 and the printed circuit board (PCB) 20 are supplied to the space under the second end portion 32 of the circuit film 30. Next, the heat and the pressure are provided to the second end portion 32 of the circuit film 30. Thus, while, the conductive particles inside the adhesion member 42 contact the wire of the second bonding surface BS2 and the wire of the printed circuit board (PCB) 20, the circuit film 30 and the printed circuit board (PCB) 20 are electrically connected.

In the described third step S30, the space that is not interfered with the display panel 10 is sufficiently formed under the second end portion 32 by the rotating device 50 in the bonding device 60. Accordingly, in the fourth step S40, the bonding work of the circuit film 30 and the printed circuit board (PCB) 20 may be easily performed while a common manufacturing device that is optimized to a case that the second end portion 32 of the circuit film 30 is positioned outside the display panel 10 is applied as it is or the common manufacturing device is not largely changed.

Figure 11:
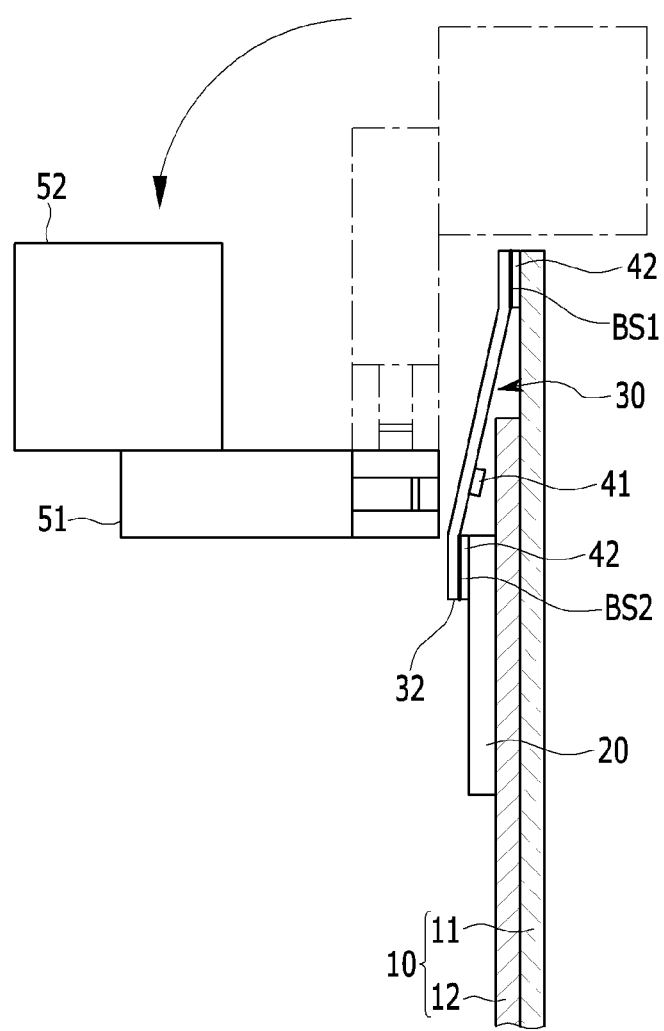

FIG. 11 is a cross-sectional view of an organic light emitting diode (OLED) display of the fifth step shown in FIG. 5.

Referring to FIG. 11, in the fifth step S50, the connection pipe 52 and the vacuum absorbing portion 51 are returned to the original position and the vacuum pressure is released such that the circuit film 30 is separated from the vacuum absorbing portion 51. Next, the display panel 10 is discharged from the bonding device 60 (shown in FIG. 10) and is moved to a following process. The display panel 10 that is discharged from the bonding device 60 may be rotated by 90 degrees to be parallel to the ground surface.

FIG. 4 to FIG. 11 illustrate the organic light emitting diode (OLED) display of the first exemplary embodiment, however the manufacturing method of the organic light emitting diode (OLED) display of the second exemplary embodiment is the same as described such that the detailed description is omitted.

Meanwhile, as shown in FIG. 1, for the circuit film 30 positioned at the lower end portion of the display panel 10, the bonding work of the printed circuit board (PCB) 20 by using the rotating device 50 may be performed. For this, after the bonding work of the fourth step S40 is completed, the display panel 10 is rotated 180 degrees, and the bonding work of the fourth step S40 may be repeated.

Meanwhile, a rotating device 50 shown in FIG. 8 of two sets may be provided to the bonding device for the described rotating device to also face the lower end portion of the display panel 10. In this case, the rotating device facing the lower end portion of the display panel 10 is taken down to be horizontal to an upper portion including the second end portion of the circuit film, and the adhesion member and the printed circuit board (PCB) are supplied to an upper space of the second end portion of the circuit film.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing an organic light emitting diode (OLED) display comprising:
   supplying a circuit film on a pad area of a display panel and bonding a first end portion of the circuit film to the pad area;
   vertically standing the display panel and inserting the display panel in a bonding device;
   holding a portion of the circuit film including a second end portion and moving the second end portion to a horizontal position by operating a rotating device;
   supplying a printed circuit board into a space under the second end portion of the circuit film, and attaching the printed circuit board to the second end portion of the circuit film; and
   operating the rotating device to move the second end portion to a vertical position, and separating the circuit film from the rotating device.

2. The method of claim 1, wherein the display panel includes a substrate having a display area and a pad area, and an encapsulation member covering the display area, and in the step of supplying the circuit film on the pad area of the display panel, the circuit film is disposed on the display panel such that the first end portion overlaps the pad area and the second end portion overlaps the encapsulation member.

3. The method of claim 2, wherein in the step of supplying the circuit film on the pad area of the display panel, the display panel is maintained in a state of being parallel to a ground surface.

4. The method of claim 1, wherein the rotating device includes:
- a vacuum absorbing portion including a plurality of vacuum nozzles and absorbing a portion of the circuit film including the second end portion by using a vacuum pressure;
- a connection pipe connected to the vacuum absorbing portion; and
- a driver installed to an end portion of the connection pipe and having a capability of rotating the connection pipe and the vacuum absorbing portion by 90 degrees.

5. The method of claim 4, wherein the rotating device comprises a plurality of vacuum absorbing portions, the number of the vacuum absorbing portions being the same as a number of circuit films arranged on the pad area, and the connection pipe is coupled to a plurality of vacuum absorbing portions.

6. The method of claim 1, wherein an adhesion member made of an anisotropic conductive film (ACF) is positioned between the first bonding surface of the first end portion and the pad area, and is positioned between the second bonding surface of the second end portion and the printed circuit board.

7. The method of claim 1, wherein the printed circuit board is not directly connected to the pad area.

8. The method of claim 6, wherein in the step of bonding a first end portion of the circuit film to the pad area, heat and pressure are provided to the first end portion of the circuit film, so that the pad area and the circuit film are electrically connected.

9. The method of claim 6, wherein in the step of attaching the printed circuit board to the second end portion of the circuit film, heat and pressure are provided to the second end portion of the circuit film, so that the printed circuit board and the circuit film are electrically connected.

10. The method of claim 1, the organic light emitting diode (OLED) display comprising a gate driver, gate wires, a data driver, data wires, and a plurality of pixels, the display panel including the plurality of pixels being positioned on the display area, the display panel including the gate wires and the data wires being positioned on both the display area and the pad area.

11. The method of claim 10, wherein at least one of the gate driver and the data driver is installed to the circuit film to drive the display panel, and the circuit film is made of a chip on film or a tape carrier package.

12. The method of claim 10, wherein the gate driver and the data driver are positioned on the pad area as a chip on glass, and the circuit film is made of a flexible printed circuit film.

* * * * *